United States Patent [19]

Veenendaal

[11] 4,069,453
[45] Jan. 17, 1978

[54] TRANSISTOR TEST FIXTURE

[75] Inventor: Cornelis Teunis Veenendaal, Cornelius, Oreg.

[73] Assignee: Tektronix, Inc., Beaverton, Oreg.

[21] Appl. No.: 771,233

[22] Filed: Feb. 23, 1977

[51] Int. Cl.$^2$ ............................................ G01R 31/22
[52] U.S. Cl. ............................. 324/158 F; 324/158 T
[58] Field of Search ......... 324/158 F, 158 T, 158 SC, 324/73 R

[56] References Cited

U.S. PATENT DOCUMENTS 3,789,301 1/1974 Malaviya ........................ 324/158 T Primary Examiner—Rudolph V. Rolinec
Assistant Examiner—Ernest F. Karlsen
Attorney, Agent, or Firm—Adrian J. LaRue

[57] ABSTRACT

A transistor test fixture for conducting reference and data measurements on transistors comprises rotatable disc means having short circuit means, through circuit means and data circuit means provided thereon. The rotatable disc means is positionable within a disc-receiving area of housing means having spaced coaxial means to provide signal input and output to the circuit means, and retaining and positioning means are provided by the rotatable disc means and the housing means to retain the disc means in the disc receiving area and to position the rotatable disc means in selected positions with the selected circuit means being in electrical connection with the coaxial means.

8 Claims, 8 Drawing Figures

TRANSISTOR TEST FIXTURE

BACKGROUND OF THE INVENTION

A large number of transistors generally in the form of strip-line packages of different sizes and configurations are available. A network analyzer instrument is best used to conduct tests on these strip-line packages to provide gain, input impedance, output impedance and other data as a function of frequency. It is also necessary to calibrate the network analyzer instrument that supplies the test signals for conducting the reference and data tests before the data tests are conducted.

The existing transistor test fixture for use with the network analyzer required that many small parts be physically assembled to make reference measurements and then removed. These parts are small and require tweezers to properly position them on the substrate. Depending on the strip-like package to be tested, it will determine what substrate will have to be used to receive the strip-line package and make electrical connection thereto. This test fixture is difficult and time consuming to use to make the required reference and data tests.

SUMMARY OF THE INVENTION

The present invention relates to test fixtures and more particularly to transistor test fixtures for conducting reference and data tests on transistors.

The transistor test fixture has a metal housing which is provided with a disc-receiving area. Coaxial cable means are disposed in the housing and each coaxial cable means is terminated at outer ends and inner ends with connector means. The inner connector means communicate with the disc-receiving area. A disc having through circuit means, short circuit means and transistor-receiving means provided with transistor-circuit means is positionable within the disc-receiving area. Means provided by the housing and the disc to position the disc in selected positions with the circuit means thereon in connection with the inner connector means. Means provided by the disc and the housing to maintain the disc in the disc-receiving area and to release the disc so that it can be removed and replaced by another disc. Means is provided by the housing for covering the disc-receiving area including means to hold the leads of the transistor in electrical engagement with the transistor circuit means.

An object of the present invention is to provide a transistor test fixture that will enable reference and data measurements be made on a transistor by moving reference circuits and data circuits into position for receiving signals.

Another object of the present invention is the provision of a transistor test fixture having a housing provided with a disc-receiving area in which disc means having reference circuit means and data circuit means is to be positioned.

A further object of the present invention is to provide a transistor test fixture having housing means provided with a disc-receiving area in which a disc means having circuit means thereon is disposed and positioning means provided by the housing means and the disc means to maintain the disc means in selected positions with the circuit means in engagement with connector means.

An additional object of the present invention is the provision of a transistor test fixture having housing means provided with a disc-receiving area in which a disc means having circuit means thereon is disposed and maintaining means provided by the housing means and the disc means for maintaining the disc means within the disc-receiving area.

Still a further object of the present invention is to provide a transistor test fixture having cover means covering a disc means and provided with means for maintaining leads of a transistor into electrical engagement with circuit means on the disc means.

These and other objects and advantages of the present invention will be apparent from the following detailed description of a preferred embodiment thereof and from the attached drawings.

DETAILED DESCRIPTION OF THE INVENTION

Figure 1:
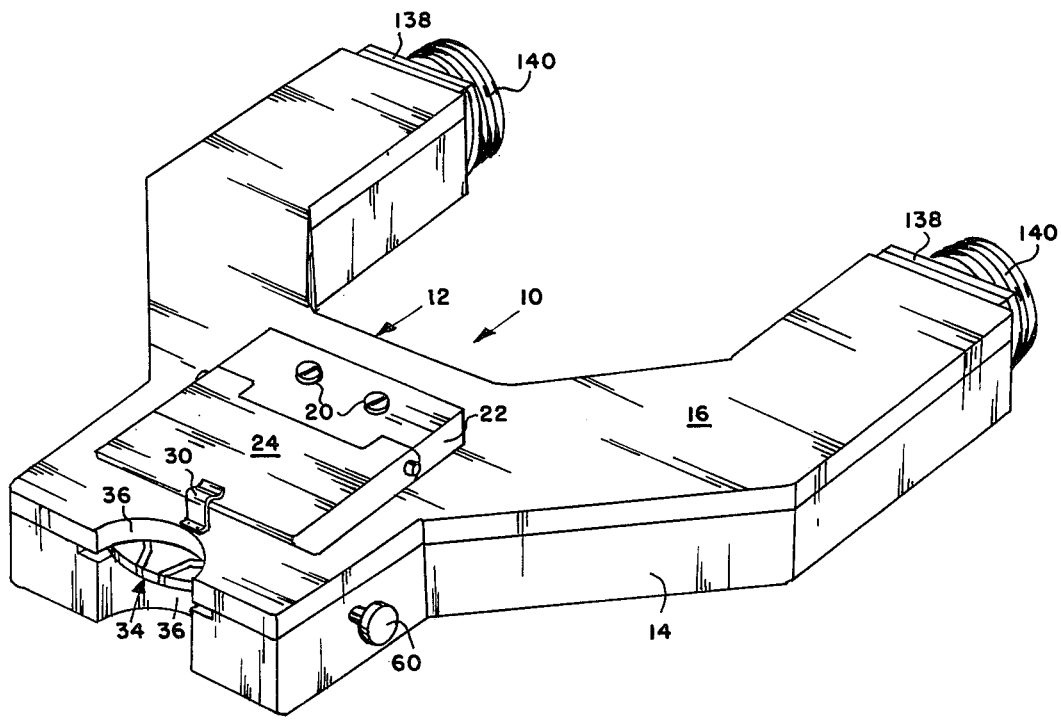
FIG. 1 is a perspective view of the transistor test fixture.

Turning now to the drawings, a transistor test fixture 10 has a Y-shaped metal housing 12 including a bottom section 14 and a top section 16 which are secured together by screws 18 and 20. Screws 20 threadably engage member 22 which has cover member 24 hingeably secured thereto. Cover member 24 covers opening 26 in top section 16 and it has secured to the inside surface thereof dielectric hold-down members 28, the function of which will be described in greater detail hereafter. A latch 30 is hingeably mounted on section 16 and latches cover 24 in position.

A disc-receiving area 32 is provided in housing 12 for receiving a disc 34 and arcuate areas 36 are provided in sections 14 and 16 to enable disc 34 to be grasped to place disc 34 within or remove it from disc-receiving area 32 or to rotate it therewithin.

Figure 4:
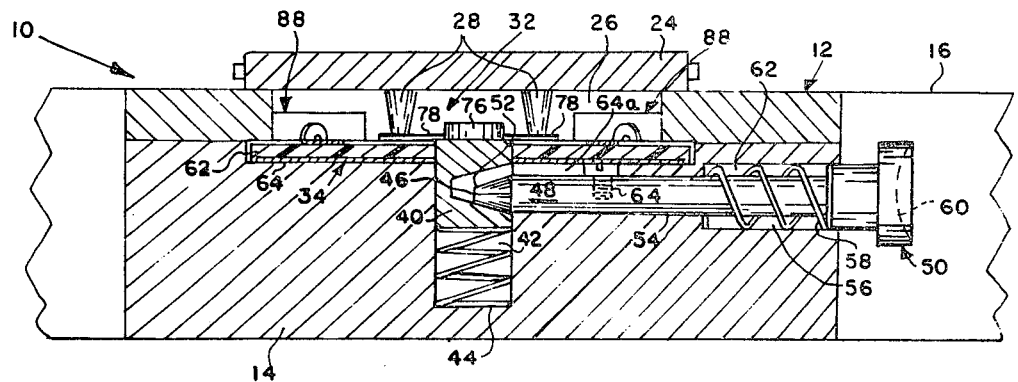
FIG. 4 is a cross-sectional view taken along lines 4—4 of FIG. 3.

Disc 34 is provided with a center aperture 38 that mates with spring-biased shaft 40 (FIG. 4) that is reciprocably disposed in hole 42 in section 14. Spring 44 is located in hole 42 and biases shaft 40 into disc-receiving area 32 and within aperture 38 to retain disc 34 in position in area 32 and to enable it to be rotated thereon. Shaft 40 has a front beveled top surface that is engages by disc 34 when it is inserted within area 32 to cam shaft 40 downwardly to permit disc 34 to be properly centered within area 32 whereupon shaft 40 is maintained in hole 42 by beveled end 46 of a shank 48 of spring-biased pin 50 which engages beveled hole 52 in shaft 40 and which is reciprocably mounted in hole 54 in section 14. Hole 54 is in communication with larger hole 56 and a coil spring 58 surrounds shank 48 and extends between head 60 and shoulder 62. A screw 64 is provided in shank 48 to maintain pin 50 in position and the head of screw 64 is disposed in slot 64a in section 14 to permit lateral movement of pin 50.

Inward movement of pin 50 causes beveled end 46 to cam shaft 40 downwardly and the outward movement of disc 34 causes disc 34 to engage a rear beveled surface of shaft 40 causing shaft 40 to be cammed downwardly further against the action of spring 44 so that aperture 38 is free of shaft 40 and disc 34 can be completely removed from area 32.

Figure 6:
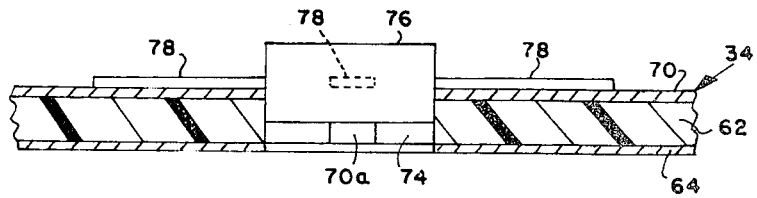
FIG. 6 is a cross-sectional view taken along lines 6—6 of FIG. 5.

Disc 34 is composed of a dielectric member 62, a conductive layer 64 covering the bottom surface of dielectric member 62 defining a ground plane and conductive paths 66, 68 and 70 are disposed on the top surface of member 62. Conductive path 66 is a through circuit means and it continues along the edge of member 62 to provide electrical contact means which are isolated from ground plane 64. Conductive path 68 is in communication with hole 72 which is a plated-through hole so that conductive path 68 is connected to ground plane 64. Conductive path 68 also extends along the edge of member 62 but isolated from ground plane 64 to also provide electrical contact means. Conductive path 68 defines short circuit means and it and circuit path 66 provide reference measurements. Conductive path 70 is a data measurement circuit and it is in communication with hole 74 in which a transistor 76 (FIG. 6) is disposed with its leads 78 extending along conductive path 70 and in electrical engagement therewith. Conductive path 70a is also in communication with hole 74 and each leg thereof extends along a section of the surface of hole 74 and is connected to ground plane 64 so that lead 78 of transistor 76 in electrical contact therewith is connected to the ground plane. The length of conductive path 66 is equal to the sum of the lengthes of both legs of conductive path 68 and the sum of the lengthes of both legs of conductive path 68 is equal to the sum of the lengthes of both legs of conductive path 70.

Indents 80 are located in the edge of disc 34 centrally of each of the conductive paths 66, 68 and 70 and they mate with ball detent 82 which is secured in a slot 84 in bottom section 14 under the bias of spring 86 in order to properly position the selected conductive path when disc 34 is rotated for electrical connection with inner coaxial connectors 88 which are secured in recesses 90 in bottom section 14.

Figure 7:
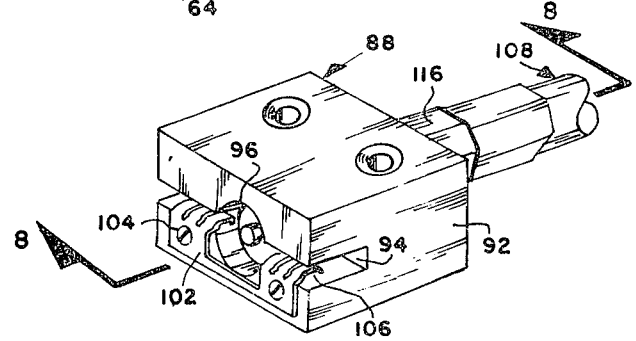
FIG. 7 is a perspective view of an inner coaxial connector means.
Figure 8:
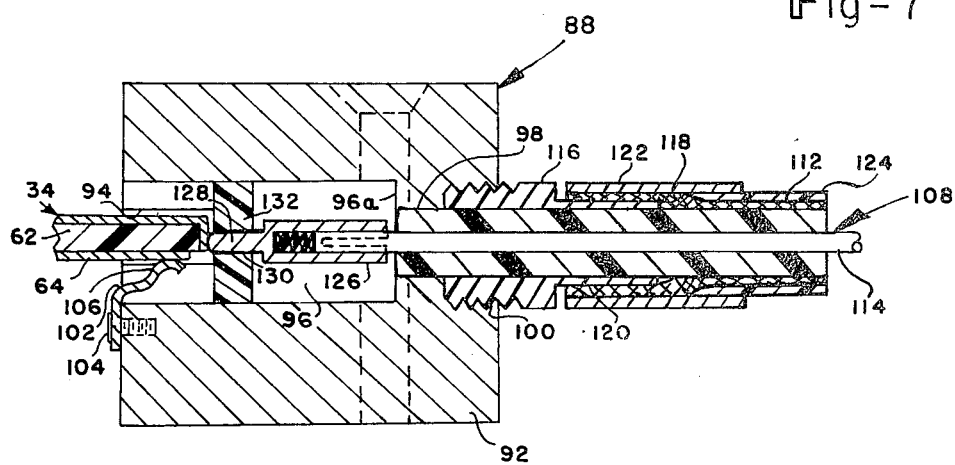
FIG. 8 is a cross-sectional view taken along lines 8—8 of FIG. 7.

FIGS. 7 and 8 illustrate an inner coaxial connector 88 which includes a metal block 92 having a slot 94 and an annular opening 96 which reduces to a section 98 of smaller diameter and then becomes a threaded section 100. A ground plane contact member 102 is secured onto block 92 via screws 104 or welding and it includes spring contact fingers 106 that electrically engage ground plane 64 of disc 34 in a wiping manner as disc 34 is positioned in disc-receiving area 32 and as it is rotated therein within slot 94.

Coaxial cable means 108 are disposed in slots 110 in bottom section 14. Inner insulation 112 and center conductor 114 of a stripped end of coaxial cable means 108 extend through a ferrule member 116 that is threadably disposed in threaded section 100. Outer conductor 118, generally in the form of a braid, is positioned onto ferrule section 120 and a metal ferrule 122 is crimped onto conductor 118 and outer insulation sheath 124 thereby electrically connecting conductor 118 to ferrule section 120 and to provide a strain relief for the cable means by ferrule 122 engaging insulation sheath 124.

Insulation 112 is in alignment with the transistion 96a between opening 96 and section 98 and center conductor 114 extends into opening 96. A spring-biased contact 126 is mounted on center conductor 114 and it includes a contact member 128 having a diameter substantially equal to that of conductor 114 and which extends through a hole 130 of dielectric disc 132. Contact member 128 electrically connects with the edge of contact means of conductive paths 66, 68 and 70 of disc 34. In order to maintain the characteristic impedance of the coaxial cable means substantially uniform, the diameter of opening 96 is larger than section 98 and the opening 130 in dielectric disc 132 has a smaller diameter than either. Bolts 136 maintain inner connectors 88 in position in recesses 90.

Outer coaxial connectors 138 are similar in construction to inner connectors 88 except that they are provided with threaded male members 140 that are threadably mated with female sections of coaxial connectors on the network analyzer instrument.

Figures 2, 5:
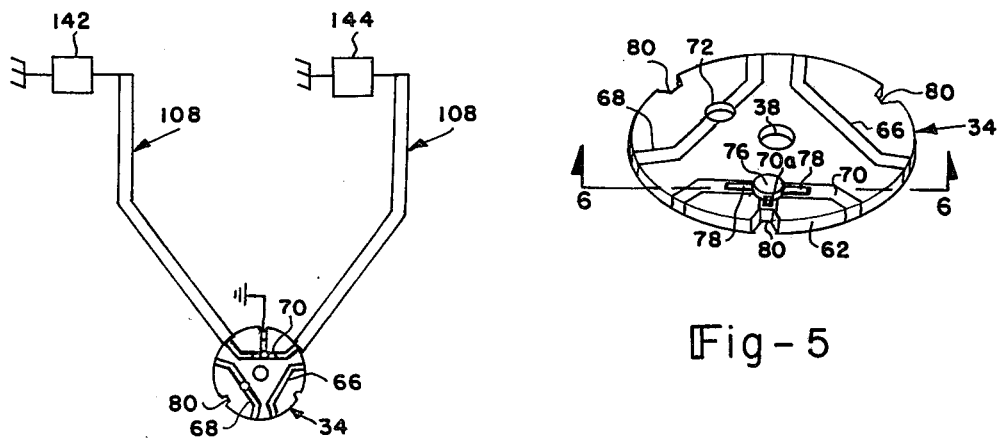
FIG. 2 is a schematic representation of the transistor test fixture in operation.
FIG. 5 is a perspective view of the disc means having the reference and data circuit means thereon with a transistor in position on the data circuit means.
Figure 3:
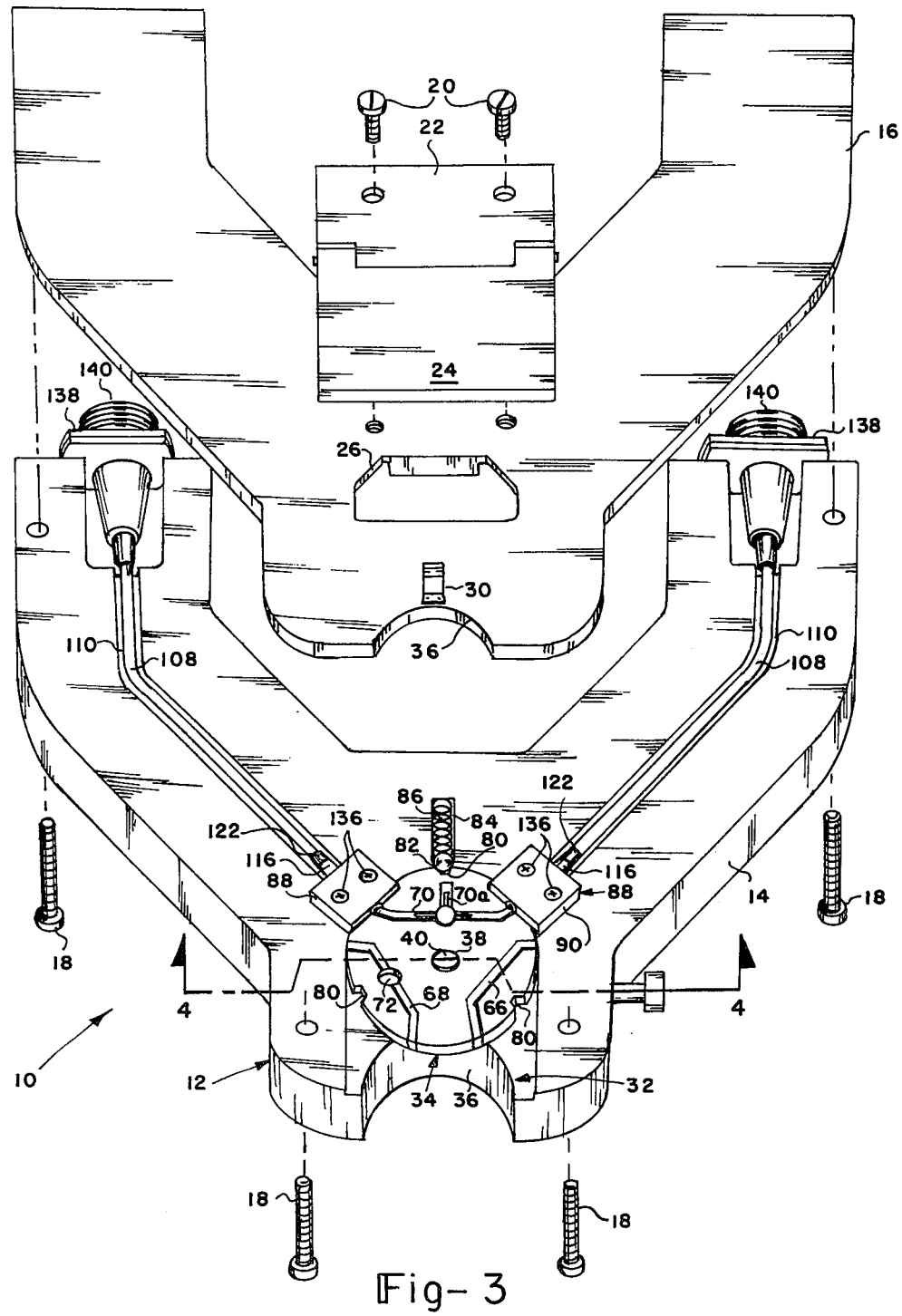
FIG. 3 is an exploded perspective view of the transistor test fixture shown in FIG. 1.

As shown in FIG. 2, conventional signal generator and detector circuits 142 and 144 are electrically connected to coaxial cables 108 to provide signals to circuit paths 66, 68 and 70 on disc 34 to provide reference and data information when testing transistor 76.

Disc 34 and the circuit paths thereon and opening 74 therein can take the necessary configuration depending on the type of transistor to be tested. Thus, a number of discs can be provided for testing the various transistors.

In operation, a disc 34 to test a selected transistor is inserted into disc-receiving area 32, and it is rotated until through circuit means 66 is positioned via ball detent 82 in engagement with indent 80 so that inner coaxial connectors 88 are in electrical engagement with circuit means 66. Signal generator circuit 142 send signals along through circuit means and these signals are detected by detector circuit 144, then signal generator circuit 144 sends signals therealong also whereby detector circuit 142 detects them. Disc 34 is then moved so that short circuit means 68 is in electrical engagement with connectors 88. Signal generator circuit 142 sends signals along circuit means 68 to plated through hole 72 and these signals are detected by detector circuit 142 and then signal generator circuit 144 sends signals along circuit means 68 to hole 72 with detector circuit 144 detecting them. The information obtained from sending signals along through circuit means 66 and short circuit means 68 is used to calibrate the network analyzer instrument or suitable measuring means to establish gain and phase information.

Disc 34 is then moved so that transistor circuit means 70 is electrically connected to connectors 88, transistor 76 is properly positioned in hole 74 with leads 78 in engagement with circuit means 70 and 70a, cover 24 is closed and latched via latch 30 so that hold-down members 28 maintain leads 78 in electrical engagement with circuit means 70 and 70a. Signal generator circuits 142 and 144 send signals along circuit means 70 and 70a thereby providing information regarding phase, input and output imedance and gain of the transistor as a function of frequency and these signals are detected by detector circuits 142 and 144.

A unique transistor test fixture has been illustrated and described to enable reference and data measurements to be easily and readily made by using a rotatable disc means having reference and data circuit means thereon which is disposed within a disc-receiving area of a housing means so that the circuit means on the disc means can be selectively connected with coaxial connector means that are connected to signal generating means.

While a preferred embodiment of the present invention has been illustrated and described, it will be apparent that changes and modifications may be made to the invention without departing from its broadest aspects. The appended claims therefore cover all such changes and modifications that come therewithin.

The invention is claimed in accordance with the following:

1. A transistor test fixture for testing transistor means, comprising:

housing means having a disc-receiving area;
   coaxial connector means provided by said housing means adjacent said disc-receiving area;
   disc means having reference circuit means and data circuit means thereon, said disc means positionable within said disc-receiving area;
   retaining means provided by said housing means and said disc means for retaining said disc means within said disc-receiving area and to permit said disc means to be removed therefrom; and
   maintaining means provided by said disc means and said housing means for maintaining said disc means in a selected position so that said reference circuit means or said data circuit means is electrically connected to said coaxial connector means.

2. A transistor test fixture according to claim 1 wherein said disc means has means for receiving transistor means therein associated with said data circuit means and hold-down means provided by said housing means to hold leads of the transistor means in electrical engagement with said data circuit means when said data circuit means is electrically connected to said coaxial connector means.

3. A transistor test fixture according to claim 1 wherein said retaining means comprises an aperture in said disc means and spring-biased shaft means in said housing means with said shaft means having beveled surface means on its outer surface.

4. A transistor test fixture according to claim 3 wherein said shaft means has a beveled hole, spring-biased pin means mounted in said housing means in engagement with said beveled hole and upon inward movement of said pin means, said shaft means is biased within said housing means to permit removal of said disc means from said disc-receiving area.

5. A transistor test fixture according to claim 1 wherein said maintaining means comprises spring-biased detent means disposed in said housing means and indent area located at selected positions in said disc means.

6. A transistor test fixture according to claim 1 wherein said reference circuit means comprise through circuit means and short circuit means.

7. A transistor test fixture for testing transistor means, comprising:

housing means having a disc-receiving area;
   transmission line means provided by said housing means including outer and inner coaxial connector means connected thereto, said inner coaxial connector means being positioned adjacent said disc-receiving area;
   disc means positionable within said disc-receiving area and including through circuit means, short circuit means and transistor circuit means with which leads of the transistor means are to be engaged;
   retaining means provided by said housing means and said disc means for retaining said disc means within said disc-receiving area and to permit said disc means to be removed therefrom;
   maintaining means provided by said housing means and said disc means for maintaining said disc means in one of selected positions so that one of said through circuit means, short circuit means and transistor circuit means is electrically connected to said inner coaxial connector means; and
   hold-down means provided by said housing means for holding the leads of the transistor means in electrical engagement with said transistor circuit means when said transistor circuit means is electrically connected to said inner coaxial connector means.

8. A transistor test fixture according to claim 7 wherein said hold-down means comprises cover means hingeably connected onto said housing means for covering an opening in said housing means in communication with said disc-receiving area, and dielectric means secured to an inside surface of said cover means for engaging the leads of the transistor means when said cover means is in a closed position.

* * * * *